United States Patent
Groepl

(10) Patent No.: US 9,107,261 B2
(45) Date of Patent: *Aug. 11, 2015

(54) CIRCUIT AND METHOD FOR CONTROLLING LIGHT-EMITTING COMPONENTS

(75) Inventor: Martin Groepl, Oberallgaeu (DE)

(73) Assignee: Silicon Line GmbH, München (DE)

(*) Notice: Subject to any disclaimer, the term of this patent is extended or adjusted under 35 U.S.C. 154(b) by 0 days.

This patent is subject to a terminal disclaimer.

(21) Appl. No.: 12/654,514

(22) Filed: Dec. 22, 2009

(65) Prior Publication Data

US 2010/0172384 A1    Jul. 8, 2010

Related U.S. Application Data

(63) Continuation of application No. PCT/EP2008/057784, filed on Jun. 19, 2008.

(30) Foreign Application Priority Data

Jun. 19, 2007   (DE) .................. 10 2007 028 576
Aug. 24, 2007   (DE) .................. 10 2007 040 151
Apr. 29, 2008   (DE) .................. 10 2008 001 452

(51) Int. Cl.
    *H01S 3/00*       (2006.01)
    *H05B 33/08*     (2006.01)
    *H01S 3/042*     (2006.01)

(52) U.S. Cl.
CPC ............ *H05B 33/0818* (2013.01); *H01S 3/042* (2013.01); *H05B 33/0806* (2013.01); *Y02B 20/346* (2013.01)

(58) Field of Classification Search
CPC ........................... H01S 5/042; H05B 33/0806
USPC ........ 372/38.03, 38.04, 38.02, 38.07, 29.014, 372/29.015
See application file for complete search history.

(56) References Cited

U.S. PATENT DOCUMENTS

| | | |
|---|---|---|
| 5,012,384 A | 4/1991 | Chew |
| 5,019,769 A | 5/1991 | Levinson |

(Continued)

FOREIGN PATENT DOCUMENTS

| | | |
|---|---|---|
| DE | 10 2004 032456 B3 | 4/2006 |
| EP | 0 798 828 A | 10/1997 |

(Continued)

OTHER PUBLICATIONS

U.S. Appl. No. 12/654,515, filed Dec. 2009, Groepl et al.

(Continued)

*Primary Examiner* — Tod T Van Roy
(74) *Attorney, Agent, or Firm* — Shlesinger, Arkwright & Garvey LLP

(57) ABSTRACT

In order to further develop a circuit arrangement or circuit, in particular driver circuit, and a method for controlling at least one light-emitting component, in particular at least one electro-optical transducer, for example at least one light-emitting diode (LED) or electroluminescent diode or at least one laser, such as at least one semiconductor laser, by switching at least one switching element at least between a first switching position and a second switching position, at least one further circuit component is switched to active or switched on in the second switching position, so that current drain and output resistance are as low as possible, so that the highest possible frequency or switching speed as well as the highest possible output voltage for the light-emitting component can be achieved, it is proposed that the light-emitting component is controlled by varying its operating voltage.

12 Claims, 4 Drawing Sheets

(56) References Cited

U.S. PATENT DOCUMENTS

| | | | |
|---|---|---|---|
| 5,672,994 | A | 9/1997 | Au et al. |
| 5,834,813 | A | 11/1998 | Ma et al. |
| 5,949,253 | A | 9/1999 | Bridgewater, Jr. |
| 6,031,855 | A | 2/2000 | Watanabe |
| 6,650,143 | B1 | 11/2003 | Peng |
| 6,667,661 | B1 | 12/2003 | Liu et al. |
| 6,812,733 | B1 | 11/2004 | Plasterer et al. |
| 6,965,722 | B1 | 11/2005 | Nguyen |
| 6,975,135 | B1 | 12/2005 | Bui |
| 7,133,429 | B2 | 11/2006 | Moran |
| 7,154,923 | B2 | 12/2006 | Kucharski |
| 7,173,851 | B1 | 2/2007 | Callahan et al. |
| 7,272,067 | B1 | 9/2007 | Huang et al. |
| 7,280,425 | B2 | 10/2007 | Keshavarzi et al. |
| 7,595,661 | B2 | 9/2009 | Kim |
| 8,194,431 | B2 | 6/2012 | Groepl et al. |
| 8,258,813 | B2 | 9/2012 | Groepl et al. |
| 2001/0043093 | A1 | 11/2001 | Sakura et al. |
| 2002/0117724 | A1 | 8/2002 | Ariyoshi et al. |
| 2003/0058725 | A1 | 3/2003 | Bell |
| 2003/0094977 | A1 | 5/2003 | Li et al. |
| 2004/0160996 | A1* | 8/2004 | Giorgi et al. ................. 372/25 |
| 2004/0195978 | A1* | 10/2004 | Horiuchi et al. .............. 315/291 |
| 2004/0208011 | A1 | 10/2004 | Horiuchi et al. |
| 2005/0185428 | A1 | 8/2005 | Crawford et al. |
| 2006/0133435 | A1* | 6/2006 | Ikeda .......................... 372/38.02 |
| 2007/0159434 | A1 | 7/2007 | Yen et al. |
| 2007/0291807 | A1* | 12/2007 | Uesaka ....................... 372/38.04 |
| 2008/0007985 | A1 | 1/2008 | Wilcox |
| 2008/0012507 | A1 | 1/2008 | Nalbant |
| 2008/0154103 | A1 | 6/2008 | LeMay |
| 2008/0304527 | A1* | 12/2008 | Gao et al. ................... 372/38.02 |

FOREIGN PATENT DOCUMENTS

| | | |
|---|---|---|
| EP | 1 777 708 A1 | 4/2007 |
| FR | 2 889 643 A | 2/2007 |
| GB | 2 365 788 A | 2/2002 |
| WO | WO2007/069104 A | 6/2007 |
| WO | WO2008/050779 A | 5/2008 |

OTHER PUBLICATIONS

U.S. Appl. No. 12/654,951, filed Jan. 2010, Groepl et al.

PCT Written Opinion, dated Jan. 12, 2010 in PCT/EP2008/057784, filed Jun. 19, 2008 (7 pages).

PCT "International Search Report", dated Jul. 10, 2008 in PCT/EP2008/057784, filed Jun. 19, 2008 (3 pages).

U.S. Appl. No. 12/901,515, filed Oct. 2010, Groepl et al.

U.S. Appl. No. 12/950,766, filed Nov. 2010, Groepl et al.

U.S. Appl. No. 13/083,282, filed Apr. 2011, Groepl et al.

PCT International Preliminary Report on Patentability and Written Opinion in application No. PCT/EP2009/054483, dated Nov. 9, 2010 (7 pages).

* cited by examiner

CIRCUIT AND METHOD FOR CONTROLLING LIGHT-EMITTING COMPONENTS

CROSS-REFERENCE TO RELATED APPLICATIONS

This application is a continuation of application no. PCT/EP2008/057784, filed Jun. 19, 2008, which claims the priority of German application no. 10 2007 028 576.2, filed Jun. 19, 2007, and which application no. PCT/EP2008/057784, filed Jun. 19, 2008, claims the priority of German application no. 10 2007 040 151.7, filed Aug. 24, 2007, and which application no. PCT/EP2008/057784, filed Jun. 19, 2008, claims the priority of German application no. 10 2008 001 452.4, filed Apr. 29, 2008, and each of which is incorporated herein by reference.

FIELD OF THE INVENTION

The present invention relates generally to the technical field of controlling light-emitting components.

The present invention relates more specifically to a circuit or circuit arrangement, in particular a driver circuit, according to the preamble of claim 1 and a method for controlling at least one light-emitting component according to the preamble of claim 11.

Within the scope of the present invention, the term light or light-emitting is understood not only as the range of electromagnetic radiation visible to the eye, extending in a wavelength range from about 380 nanometers to about 780 nanometers (which corresponds to a frequency of about 789 terahertz down to about 385 terahertz).

Rather, the term light or light-emitting is understood as the entire electromagnetic wavelength or frequency spectrum, including the spectrum not visible to the eye, in particular the I [nfra] R[ed] range (wavelength range up to about 2,000 nanometers or frequency range down to about 150 terahertz), for example a wavelength of about 850 nanometers or a frequency of about 350 terahertz.

BACKGROUND OF THE INVENTION

Exemplary circuit arrangements known from the prior art for controlling a light-emitting component E for the purposes of data transmission from the light-emitting component E (=so-called source) to a light-receiving component (=so-called sink) are shown in FIG. 5A to FIG. 5C.

Typically, a semiconductor laser or an electroluminescent diode is used as light-emitting component E, in particular as an optical transmitting element or as an optical source, for optical data transmission.

This semiconductor laser or this electroluminescent diode is, according to the prior art, for example supplied by an electronic driver circuit S1 (cf. FIG. 5a), S2 (cf. FIG. 5B) or S3 (cf. FIG. 5C) with the necessary operating voltage, the bias current and the modulation current for correct operation.

The driver circuit S1, S2, S3 can be constructed both as an integrated circuit (or IC=Integrated Circuit) and also discretely from individual components on a printed circuit board (or PCB=Printed Circuit Board).

In the example from the prior art shown in FIG. 5A, the light-emitting component E can be powered via a first current path $I_1$ and additionally via a second current path $I_2$. For this purpose in the first current path the current $I_1$ flows from a DC voltage source Q via the light-emitting component E to a constant current source K1 for $I_1$.

By switching to active or switching on the second current path $I_2$ by means of a switch U which controls the current level of the light-emitting component E, the entire current $I_{ges}=I_1+I_2$ flows through the light-emitting component E, otherwise the current $I_1$. A constant current source K2 is provided for the power supply of the second current path $I_2$.

The modulation of the light-emitting component E is thus effected in the form of current adjustment or current modulation, that is by temporally varying the current intensities flowing through the light-emitting component E between the values $I_1$ and $I_1+I_2$.

The arrangement of switch U and dummy load R has the effect that at the switch U the same current always flows in relation to the node point assigned to the second current path $I_2$, wherein when the second current path $I_2$ is not switched to the light-emitting component E, the current $I_2$ in the dummy load R is substantially converted into thermal energy which can, for example, be up to about fifty percent of the operating time of the light-emitting component; however, the current $I_2$ is disadvantageously also present when this current $I_2$ is no longer needed.

Furthermore, in the example from the prior art shown in FIG. 5A, the two constant current sources K1 and K2 are arranged in the high-frequency path (, i.e. not in the supply path) which necessarily involves parasitic capacitances. Also in the example from the prior art shown in FIG. 5A, an undesirable high voltage drop or a high saturation voltage necessarily occur.

In the second exemplary driver circuit S2 according to the prior art shown in FIG. 5B, when the second current path $I_2$ is switched to active or switched on, the current $I_1+I_2$ flows through the light-emitting component E by means of the switch U which controls the current level, otherwise the current $I_1$; however, the current $I_2$ is disadvantageously also present when this current $I_2$ is no longer needed.

The operating voltage of the light-emitting component E depends on the supply voltage supplied by the voltage source Q (=for example about three volts) and on the constant current source K1 or on the constant current sources K1, K2.

In the third exemplary driver circuit S3 according to the prior art shown in FIG. 5C, either the current $I_1+0.5I_2$ or the current $I_1-0.5I_2$, which results in a current difference of $I_2$, flows through the light-emitting component E depending on the position of the switch U which controls the current level.

The arrangement of a (not obligatory) inductor L at which, for example, a voltage loss of about 0.5 volt occurs, is usually used to increase the impedance of the constant current source K1 at high frequencies and consequently makes it possible to use a constant current source K1 which does not have a high output impedance at high frequencies.

In addition to the previously described driver circuit S3, a driver circuit with inductor is also known from the prior art document U.S. Pat. No. 6,667,661 B1.

In the electronic driver circuit S3 shown in FIG. 5C, it is disadvantageously necessary to provide external components, that is, disposed outside the integrated circuit, such as a capacitor C.

As a result of the arrangement of inductor L and capacitor C, undesirable electromagnetic interference effects such as electromagnetic oscillations can furthermore occur. In this connection, for example, the prior art document U.S. Pat. No. 7,133,429 B2 is concerned with the problem of avoiding electromagnetic oscillations of a laser driver circuit with signal-amplified data transmission.

Another disadvantage of conventional circuit arrangements is their high voltage drop across the components in series with the light-emitting component. Particularly for applications in which only a small supply voltage is available, this conflicts with the aim of providing the highest possible operating voltage at the light-emitting component.

The technical formulation of the problem of providing a driver circuit for optical data transmission with low power drain is known, for example, from the prior art documents U.S. Pat. Nos. 6,965,722 B1 and 7,154,923 B2. However, the structure of the driver circuits described in these documents is very complex.

In addition, circuit arrangements known from the prior art disadvantageously have high output resistances (=real parts of the output impedances). This limits the speed, in particular for the transient ringing (or settling) or the circuit arrangement since the maximum switching frequency f behaves substantially reciprocally proportional to the product of the total capacitance C and total resistance R at the output of the controlling or driver circuit, wherein the total capacitance C, for example, is substantially dominated by the parasitic capacitive effect of the light-emitting component and the total resistance R is substantially given by the parallel circuit of the output resistance of the driver circuit and the input resistance of the light-emitting component.

Finally, another technical problem of conventional circuit arrangements is a (too) low output voltage at the light-emitting component since the constant current source(s) require(s) a voltage (drop) of, for example, about 0.5 volt (a small voltage drop in the order of, for example, about 0.2 volt also occurs at the voltage source providing the supply voltage as long as this is a regulated voltage source).

Another small voltage drop in the order of, for example, about 0.1 volt occurs at the switching element U so that (too) little voltage occurs across the light-emitting component and therefore (too) little voltage is available at the light-emitting component.

OBJECTS AND SUMMARY OF THE INVENTION

Starting from the previously outlined disadvantages and inadequacies and acknowledging the outlined prior art, it is the object of the present invention to further develop a circuit arrangement of the type specified initially and a method of the type specified initially so that the previously outlined disadvantages and inadequacies are avoided; in particular current drain and output resistance should be as low as possible so that the highest possible frequency or switching speed as well as the highest possible output voltage for the light-emitting component can be achieved.

This object is achieved by a circuit arrangement having the features specified in claim 1 and by a method having the features specified in claim 11, in particular by a voltage-driven circuit arrangement comprising at least one voltage-limiting element, for example at least one non-linear resistance.

The voltage-limiting element behaves at low voltages in particular like at least one diode polarized in the forward direction, such as at least one pn diode or at least one Schottky diode, or like at least one voltage-dependent resistance with non-linear characteristic, or like at least one varistor, or like at least one transistor connected as source follower, or like at least one Zener diode.

This means that a preferred embodiment of the voltage-limiting element features a substantially current blocking effect at a low voltage, in particular at a voltage smaller than about one volt, for example at a voltage smaller than about 0.2 volt, and allows for a strong current rise starting from a certain critical value or threshold value of the voltage, in particular starting from a breakdown voltage of about 0.2 volt.

The voltage-limiting element can be short-circuited by at least one switching element, in particular by at least one closing switch or by at least one reversing switch or by at least one changeover switch, for example by at least one switching transistor, such as for example by at least one M [etal] O [xide] S [emiconductor] F [ield] E [ffect] T [ransistor]. In this way, at least two operating states of the circuit arrangement with low impedances in each case, in particular without further current losses, can be achieved.

Advantageously, in the first switching position of the switching element the entire or almost the entire voltage provided by the supply element drops across the light-emitting component; exemplarily, in the first switching position of the switching element at least about ninety percent, for example about 99 percent, of the voltage provided by the supply element may drop across the light-emitting component.

A supply element in the sense of the present invention can, for example, be achieved as at least one voltage source or as a combination of current source and decoupling capacitor so that a low output impedance is produced for the relevant operating frequencies.

The light-emitting component can thus be controlled by varying its operating voltage, i.e. the voltage the light-emitting element is supplied with, in particular the voltage entering into the light-emitting component and can, for example, be used for optical data transmission. For this purpose, the light-emitting component converts electrical signals into optical signals which are coupled into an optical waveguide, for example, into a glass fiber or into a plastic fiber.

In the present invention, the light-emitting component is therefore voltage-driven in at least two operating points which can be configured by means of the switching element and optionally by means of at least one control device, in particular signal source, for controlling the switching element.

The circuit arrangement according to the invention is particularly advantageous on account of its low power drain. The power drain is particularly low because, unlike the prior art, there is no other current path outside the light-emitting component.

Furthermore, in the present invention the person skilled in the art will particularly appreciate the comparatively high output voltage available for the light-emitting component.

Furthermore, the low output impedance is a further advantage of the present invention. This makes it possible to achieve a high speed, particularly for the settling of the circuit arrangement since the maximum switching frequency f behaves substantially reciprocally proportional to the product of the total capacitance C and total resistance R at the output of the controlling or driver circuit, wherein the total capacitance C, for example, is substantially dominated by the parasitic capacitive effect of the light-emitting component and the total resistance R is substantially given by the parallel circuit of the output resistance of the driver circuit and the input resistance of the light-emitting component.

The light-emitting component can in particular be an electro-optical transducer, for example a light-emitting diode (=L

[ight] E [mitting] D[iode]), such as an electroluminescent diode, or a laser (=Light Amplification by Stimulated Emission of Radiation), such as a semiconductor laser.

The controlling of the light-emitting component is effected, for example, for the purposes of data transmission from at least one light-emitting component (=so-called source) to at least one light-receiving component (=so-called sink).

The data transmission can take place, for example, via at least one carrier medium such as via glass fibers or via plastic fibers or also via air as carrier medium or through vacuum.

The present invention finally relates to the use of at least one circuit arrangement, in particular of at least one driver circuit, according to the type presented hereinbefore and/or of a method according to the type presented hereinbefore
- in at least one, in particular mobile, telecommunication system, for example in at least one communication device, such as in at least one mobile telephone,
- in at least one, in particular mobile, data communication system or in at least one, in particular mobile, data processing device, for example in at least one handheld, in at least one notebook or in at least one P [ersonal] D [igital] A [ssistant],
- in at least one, in particular mobile, data recording and/or reproducing device, for example in at least one camcorder, in at least one digital camera or in at least one H [igh] D [efinition] T [ele] V [ision] or
- in at least one transportation means, for example in at least one driver assistance system or in at least one navigation system of an automobile.

In a mobile communication device or in a mobile data processing device, the present invention can be used particularly advantageously since in these areas of application, the supply voltage provided by the battery or by the rechargeable battery unit, in everyday language accumulator, is limited; in the sense of the longest possible operating time of the rechargeable battery, the efficient dealing with the supply voltage and the power uptake made possible by the present invention is of particular benefit.

As a result, by controlling the light-emitting component by means of varying its operating voltage, that is by the present voltage-driven approach according to the present invention, a very low output impedance and therefore a very high frequency or switching speed can be achieved.

Irrespectively therefrom, a very high output voltage or a very small output resistance for the light-emitting component can be achieved in the present invention.

Compared with conventional circuit arrangements from the prior art, the circuit arrangement according to the present invention comprises a significantly smaller current drain since the operating voltage of the light-emitting component is varied by means of the voltage-limiting element whereas conventionally the operating voltage of the light-emitting component has been varied by means of at least two current sources.

The voltage drop across the voltage-limiting element is significantly smaller than the voltage drop across current sources used in the prior art. Moreover, for varying the operating voltage of the light-emitting component the present invention requires, unlike the prior art, no second current path; in fact, according to the present invention the operating voltage of the light-emitting component can be varied by means of at least one voltage-limiting element.

The person skilled in the art in the technical field of controlling light-emitting components will particularly appreciate that the circuit arrangement according to the present invention and also the method according to the present invention have both a low output impedance and a low energy drain.

As has already been discussed hereinbefore, there are various possibilities for configuring and further developing the teaching of the present invention in an advantageous manner. For this purpose, on the one hand reference is made to the claims subordinated to claim 1 and claim 11 and other hand, further embodiments, features and advantages of the present invention are explained in detail hereinafter inter alia with reference to the exemplary embodiments illustrated by FIG. 1 to FIG. 4C.

BRIEF DESCRIPTION OF THE DRAWINGS

It is shown in.

The same or similar embodiments, elements or features are provided with identical reference numerals in FIG. 1 to FIG. 5C.

DETAILED DESCRIPTION OF THE INVENTION

Figure 1:
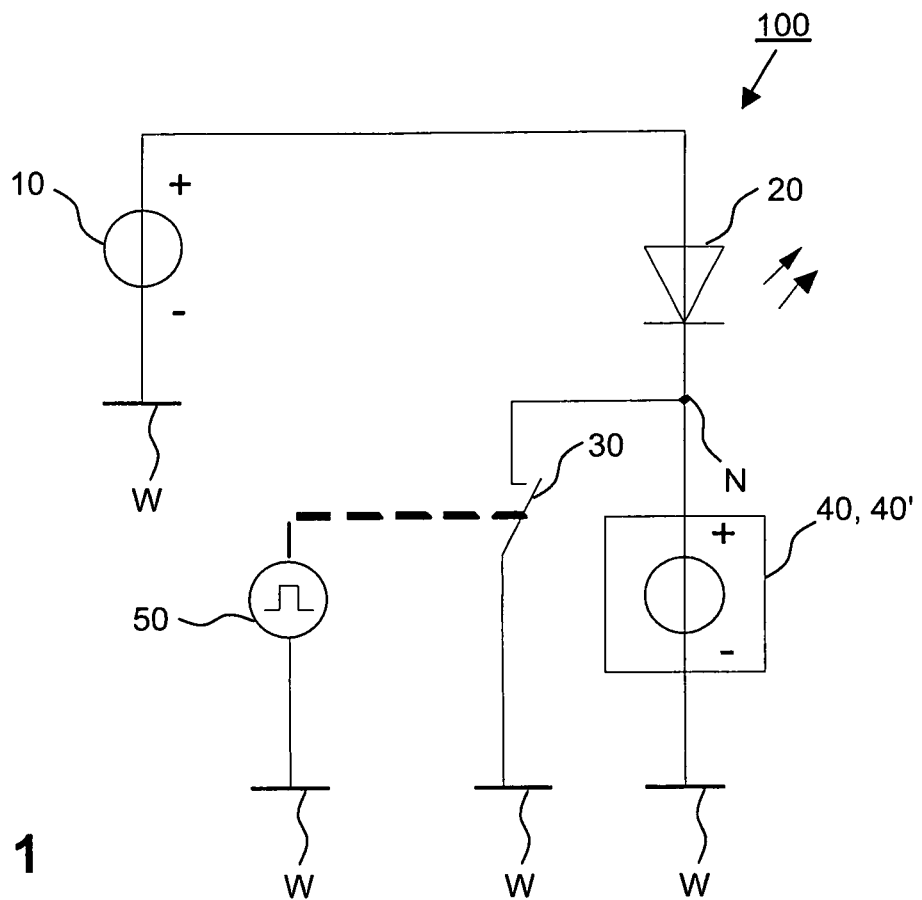
FIG. 1 in a schematic diagram an exemplary embodiment of a circuit arrangement according to the present invention operating according to the method of the present invention.
Figure 2:
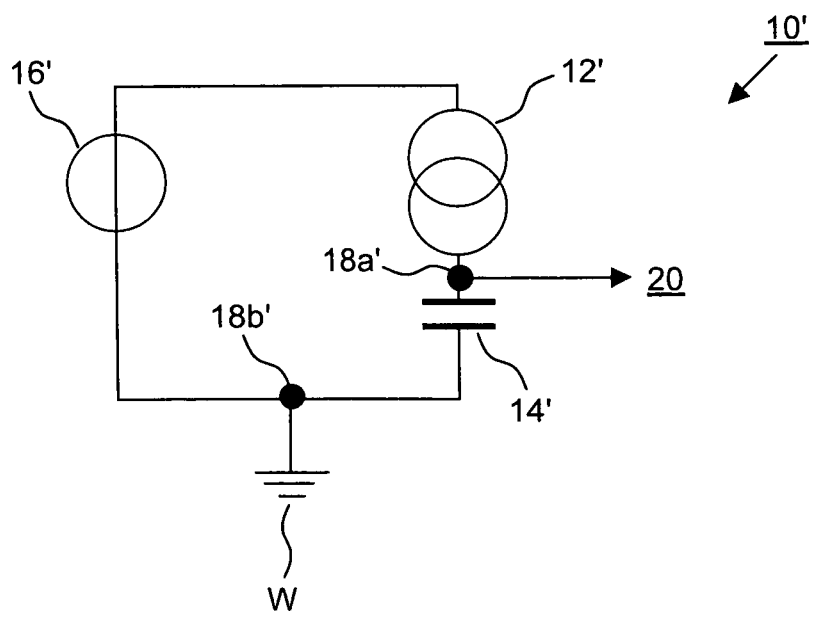
FIG. 2 in a schematic diagram a second exemplary embodiment of a supply element of the circuit arrangement from FIG. 1.
Figure 3A:
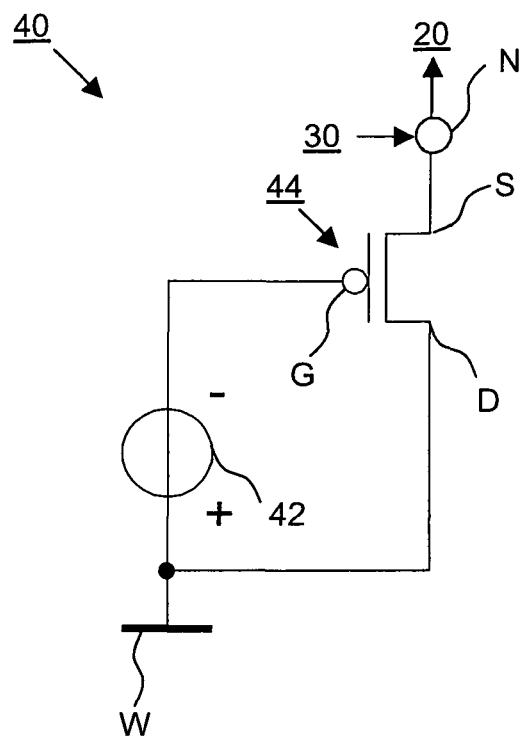
FIG. 3A in a schematic diagram a first exemplary embodiment of a voltage-limiting element for the circuit arrangement from FIG. 1.
Figure 3B:
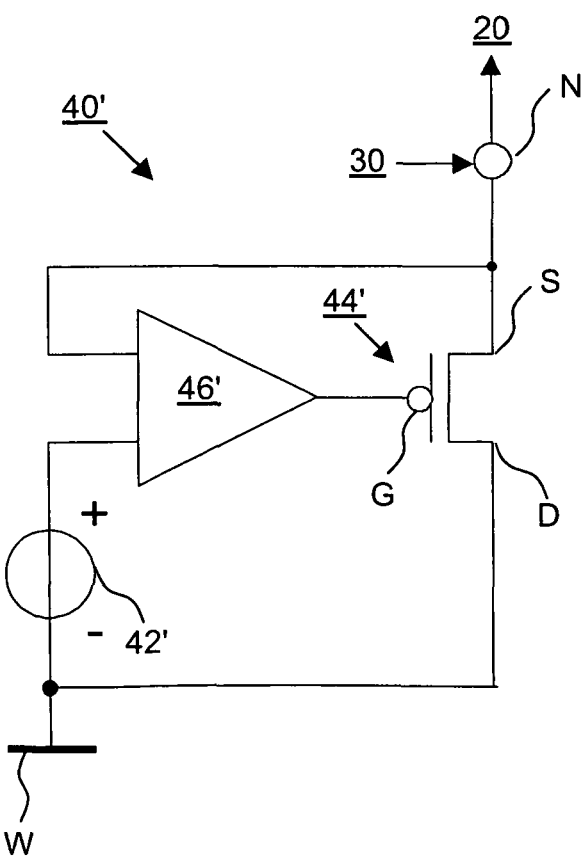
FIG. 3B in a schematic diagram a second exemplary embodiment of a voltage-limiting element for the circuit arrangement from FIG. 1.

In order to avoid superfluous repetitions, the following explanations regarding the embodiments, features and advantages of the present invention—unless specified otherwise—relate
- both to the circuit arrangement 100 shown in FIG. 1 including the first exemplary embodiment of a supply element or first supply element 10
- also to the second exemplary embodiment of a supply element 10' shown in FIG. 2
- also to the first exemplary embodiment of a voltage-limiting element 40 shown in FIG. 3A and
- also to the second exemplary embodiment of a voltage-limiting element 40' shown in FIG. 3B.

In the exemplary embodiment of the present invention illustrated by reference to FIG. 1, a circuit arrangement 100 is shown, i.e. a controlling circuit or driver circuit, for controlling a light-emitting component 20, for example a light-emitting diode (=L [ight] E [mitting] D [iode]) or electroluminescent diode or a laser, for example a semiconductor laser.

In addition to the light-emitting component 20, the circuit 100 comprises a first exemplary embodiment of a supply element 10, in particular a rechargeable battery unit, operated towards a reference potential W, in particular towards earth potential or ground potential or zero potential, for the voltage supply of the circuit arrangement 100.

Instead of the first exemplary embodiment of a supply element 10, in particular of a rechargeable battery unit, shown in FIG. 1, a second exemplary embodiment of a supply element 10' in the form of a current source supported by a decoupling capacitor on the output side, as shown in FIG. 2, can be provided, possibly as a combination or interconnection of current source 12' optimized for applications at low frequencies and decoupling capacitor 14'. For providing a supply voltage 16' the supply element 10' comprises a battery.

In this case, the current source 12' according to FIG. 2 is used for tracking the current as required, features a small voltage drop and works against the "steady" node 18a' supported by the capacitance 14'.

Specifically, the decoupling capacitor 14' is used for reducing the impedance of the node 18a' for the range of switching and operating frequencies of the controlling or driver circuit 100. Since an increase in the capacitance at the node point 18a' advantageously acts on the decoupling effect at this node point 18a', no upper limit for its parasitic output capacitance is to be noted in principle when dimensioning the current source 12'.

Hence, the current source 12' can be dimensioned such that it operates as prescribed even with a very small voltage difference between the voltage supply 16' (so-called Thévenin voltage supply) and the voltage at the node point 18a'.

Figure 5A:
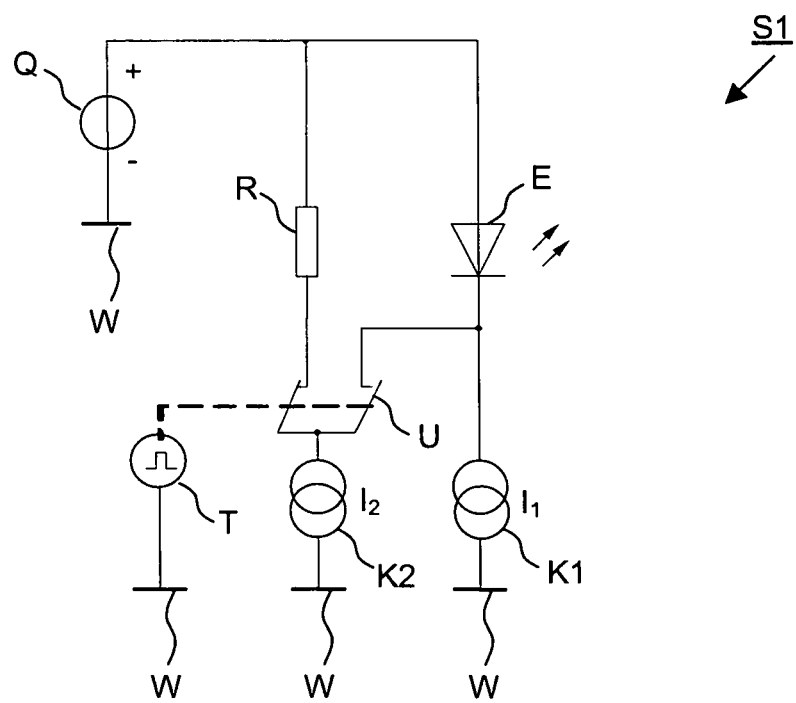
FIG. 5A in a schematic diagram a first exemplary embodiment of a circuit arrangement according to the PRIOR ART.

Furthermore, the second exemplary embodiment of a supply element 10' shown in FIG. 2 features the disposition of the current source 12' (unlike the prior art, for example according to FIG. 5A) not in the high-frequency signal path, but advantageously in the supply path so that no parasitic capacitances occur in the signal path; besides, neither an undesirable high voltage drop nor a high saturation voltage occur.

The supply element 10' according to FIG. 2 is connected in analogy to the supply element 10 according to FIG. 1 into the controlling or driver circuit 100 provided for controlling the light-emitting component 20.

Specifically, the first connection or first node 18a' of the supply element 10' is assigned to, in particular connected to, the light-emitting component 20 to be controlled, with the first connection or first node 18a' being disposed between current source 12' and decoupling capacitor 14'; the second connection or second node 18b' of the supply element 10' is at the reference potential W, in particular at earth potential or ground potential or zero potential, with the second connection or second node 18b' being disposed between decoupling capacitor 14' and voltage supply 16'.

As shown in FIG. 1, the circuit arrangement 100 is further assigned a switching element 30, in particular a closing switch, for example a switching transistor such as a M[etal] O[xide] S[emiconductor] F[ield] E[ffect] T[ransistor].

The switching element 30 is configured for controlling the light-emitting component 20 by means of switching at least between a first switching position and a second switching position, wherein in the first switching position (not shown in FIG. 1 merely for reasons of clarity of presentation) the entire or almost the entire voltage provided by the voltage source 10, in particular about ninety percent, for example about 99 percent, drops across the light-emitting component 20.

On the other hand, at the second switching position (shown in FIG. 1) of the switching element 30 a further circuit component 40, i.e. a voltage-limiting element 40 is switched to active or switched on, the voltage-limiting element 40 being intended for varying the operating voltage of the light-emitting component 20.

By providing this voltage-limiting element 40 acting like a constant voltage source (--> low output impedance), the output resistance can be kept very low at the driver circuit 100, so that a very high operating frequency or switching speed can be achieved.

In the particular case of the present invention, a very high output voltage can be achieved for the light-emitting component 20 since only a very small voltage drop occurs via the switch 30; in addition, the current source 12' is advantageously disposed in the supply path and not in the high-frequency signal path.

With the supply voltage provided by the voltage source 10 being, for example, about 2.4 volt, the voltage drop across the electro-optical transducer 20, i.e. across the light-emitting component is about 2 volt in the second switching position, i.e. with the closing switch 30 being opened, and the voltage drop across the voltage-limiting element 40 is about 0.4 volt.

When the closing switch 30 is closed (=first switching position), the voltage-limiting element 40 is short-circuited, and the voltage drop across the light-emitting component 20 jumps to about 2.4 volt. This means that, with the closing switch 30 closed, almost the entire supply voltage (, i.e. about 2.4 volt in the example) of the voltage source 10 is available at the light-emitting component 20.

At the exemplary embodiment shown in FIG. 1, the voltage-limiting element 40 is connected
  in parallel to the switching element 30 in the first switching position and
  in series to the light-emitting component 20 in the second switching position.

For controlling the switching of the switching element 30, the driver circuit 100 further comprises a control device 50, for example in the form of a signal source, assigned to the switching element 30.

The voltage-limiting element 40, 40' according to FIG. 1 may be implemented for example
  as shown in FIG. 3A in the first exemplary embodiment (--> reference numeral 40) or
  as shown in FIG. 3B in the second exemplary embodiment as circuit arrangement (--> reference numeral 40').

An essential feature of the voltage-limiting element 40, 40' is that, at low voltages, it comprises an effect
  like at least one varistor, or
  like at least one diode polarized in the forward direction, such as at least one pn diode or at least one Schottky diode, or
  like at least one transistor connected as source follower, or
  like at least one Zener diode.

Figure 4:
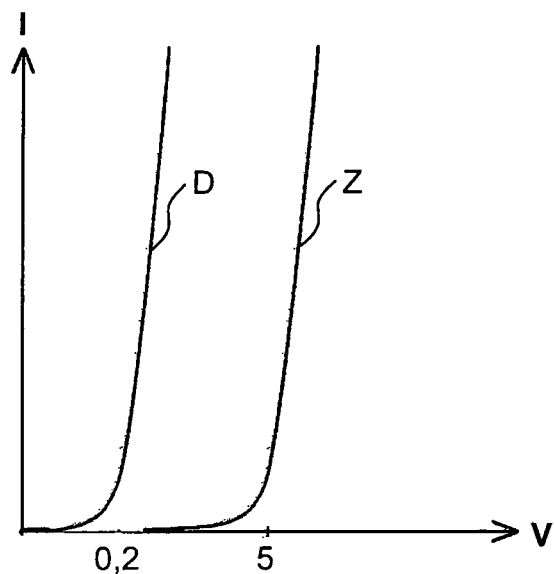
FIG. 4 in a diagrammatic view the non-linear resistance effect of the voltage-limiting element from FIG. 3A or from FIG. 3B.

In this case, a Zener diode or Z diode is a reverse-biased semiconductor diode which exhibits, when exceeding a certain voltage, the so-called Zener voltage, a very strong current rise based on the Avalanche effect or on the Zener effect. This strong current is illustrated in FIG. 4 by the forward characteristic Z.

The Zener effect, based on a jumping change of the resistance value of the Zener diode, is achieved by well-targeted doping of the semiconductor material (=mostly substantially silicon) and can occur at voltages from few volts up to some hundred volts. In the example shown in FIG. 4, the jumping change Z of the resistance value occurs at about five volts up to about six volts.

In contrast thereto, at the voltage-limiting element 40, 40' such jumping change already occurs at voltages smaller than one volt, for example at voltages of about 200 millivolts. The forward characteristic of the voltage-limiting element 40, 40' is annotated by the reference numeral D in FIG. 4.

This means that the voltage-limiting element 40, 40' features a substantially current blocking effect at a low voltage, in particular at a voltage smaller than about one volt, for example at a voltage smaller than about 0.2 volt, and allows for a strong current rise starting from a certain critical value or threshold value of the voltage, in particular starting from a breakdown voltage of about 0.2 volt.

To this end, the voltage-limiting element 40 or 40' comprises a supply element or second supply element 42 or 42', in particular a voltage source or a current source supported by a decoupling capacitor on the output side, and a transistor 44 or 44', in particular a p-channel transistor, for example a p-channel F [ield] E [ffect] T [ransistor].

The transistor 44 or 44' comprises a gate connection G, to which a voltage is supplied by the supply element 42 or 42', a source connection S assigned to an, in particular low-resistance, node point N connecting the light-emitting component 20, the switching element 30 and the voltage-limiting element 40 or 40', and a drain connection D assigned to the reference potential W, in particular ground.

When the source gate voltage (=voltage measured from source to gate) is smaller than the threshold voltage of the transistor 44, 44', in particular when the voltage present at the gate connection G is greater than the voltage present at the source connection S, the transistor 44, 44' features a high resistance and blocks.

Correspondingly, the transistor 44, 44' opens and features a low, in particular negligible, resistance, when the source gate voltage (=voltage measured from source to gate) is greater than the threshold voltage of the transistor 44, 44', in particular when the voltage present at the gate connection G is smaller than the voltage present at the source connection S.

A conventional p-channel transistor comprises a threshold value voltage of about 400 millivolts. At the exemplary embodiment shown in FIG. 3A, the p-channel transistor 44 is—unlike a conventional p-channel transistor—not earthed but supplied with a negative voltage instead.

As a result of the supply with a negative voltage, the p-channel transistor 44 from FIG. 3A has its threshold voltage characteristic (illustrated as breakdown characteristic D in FIG. 4) already at smaller voltages than a conventional p-channel transistor. When for example the p-channel transistor 44 is supplied with a voltage of about minus 200 millivolts, its threshold value voltage is about 200 millivolts.

At the exemplary embodiment shown in FIG. 3B, the transistor 44' is supplied with a positive voltage, for example with 200 millivolts. The voltage-limiting element 40' comprises a regulating/processing element 46', i.e. an amplifier and/or comparator.

The amplifier and/or comparator is configured to determine the voltage present at the source connection S of the transistor 44', to compare the determined voltage with the voltage provided by the supply element 42' and to activate as well as to open the transistor 44' connected as source follower, when the voltage provided by the supply element 42' is smaller than the voltage present at the source connection S of the transistor 44'

By means of the amplifier and/or comparator 46', the voltage at the node point N is thus compared with an auxiliary voltage provided by the supply element 42'. With the voltage in the node point N exceeding the value of this auxiliary voltage, the amplifier and/or comparator 46' generates a control signal opening the transistor 44' such widely that the voltage in the node point N no further rises.

In principle, the present invention can be configured in numerous ways; in particular, by adding additional components or additional elements in the signal and regulating paths, the present invention can be adapted to specific requirements.

In this connection, attention may also be drawn to the fact that the term "connection" within the scope of the present invention also comprises connections or types of connection which are made by additionally inserted components or elements.

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

List of Reference Numerals

100 circuit arrangement, in particular control circuit or driver circuit
(=exemplary embodiment of the present invention; cf. FIG. 1)

10 supply element, in particular voltage source, for example rechargeable battery unit, for supplying the circuit arrangement 100 with voltage, in particular with direct voltage
(=first exemplary embodiment of the present invention; cf. FIG. 1)

10' supply element, in particular current source supported by a decoupling capacitor on the output side, for example combination of current source 12' and decoupling capacitor 14', for supplying the circuit arrangement 100 with voltage
(=second exemplary embodiment of the present invention; cf. FIG. 2)

12' current source of the supply element 10'
(=second exemplary embodiment of the present invention; cf. FIG. 2)

14' decoupling capacitor, in particular capacitive support, of the supply element 10'
(=second exemplary embodiment of the present invention; cf. FIG. 2)

16' voltage supply, in particular Thévenin voltage (supply), for example battery, of the supply element 10'
(=second exemplary embodiment of the present invention; cf. FIG. 2)

18a' first connection or first node of the supply element 10'
(=second exemplary embodiment of the present invention; cf. FIG. 2)

18b' second connection or second node of the supply element 10'
(=second exemplary embodiment of the present invention; cf. FIG. 2)

20 light-emitting component, in particular electro-optical transducer, for example light-emitting diode (=L [ight] E [mitting] D [iode]) or electroluminescent diode or laser, such as semiconductor laser
(=exemplary embodiment of the present invention; cf. FIG. 1)

30 switching element, in particular closing switch or reversing switch or changeover switch, for example switching transistor, such as M [etal] O [xide] S [emiconductor] F [ield] E [ffect] T [ransistor]

Figure 5B:
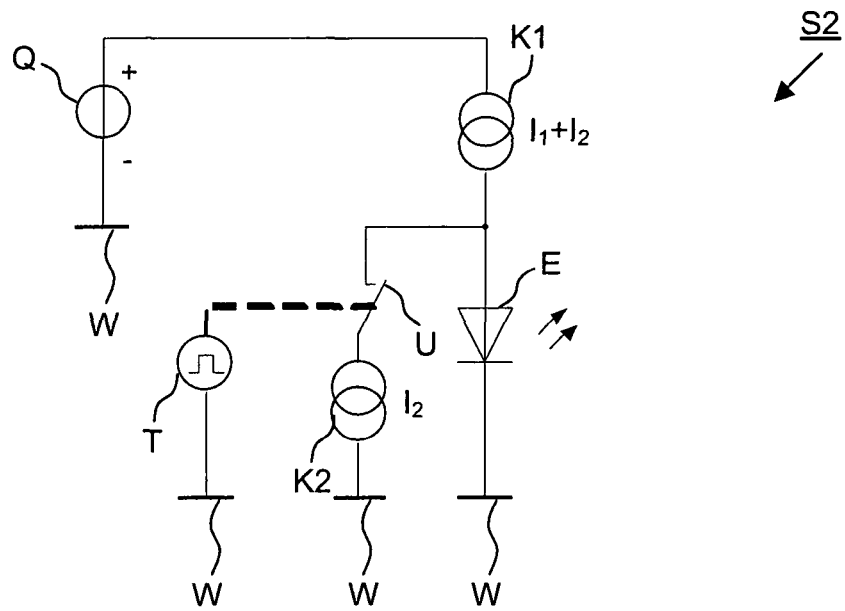
FIG. 5B in a schematic diagram a second exemplary embodiment of a circuit arrangement according to the PRIOR ART.
Figure 5C:
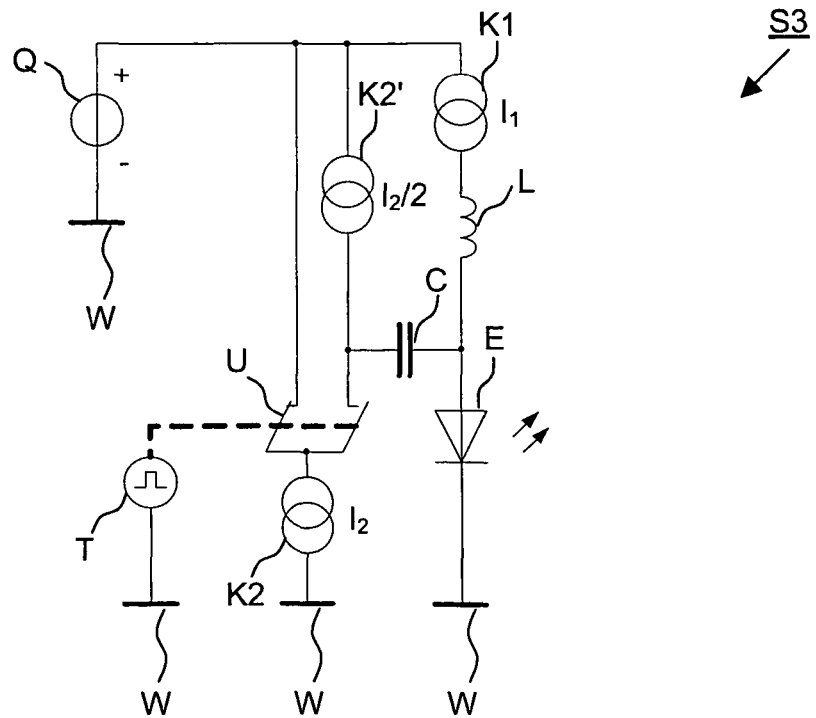
FIG. 5C in a schematic diagram a third exemplary embodiment of a circuit arrangement according to the PRIOR ART.

(=exemplary embodiment of the present invention; cf. FIG. 1)
40 further circuit component, in particular voltage-limiting element or constant voltage source, for example non-linear resistance
(=first exemplary embodiment of the present invention; cf. FIG. 1, FIG. 3A)
40' further circuit component, in particular voltage-limiting element or constant voltage source, for example non-linear resistance
(=second exemplary embodiment of the present invention; cf. FIG. 1, FIG. 3B)
42 supply element, in particular voltage source or current source supported by a decoupling capacitor on the output side, for supplying the further circuit component 40 with voltage, in particular with a negative voltage, for example with about minus 200 millivolts
(=first exemplary embodiment of the present invention; cf. FIG. 3A)
42' supply element, in particular voltage source or current source supported by a decoupling capacitor on the output side, for supplying the further circuit component 40' with voltage, in particular with a positive voltage, for example with about 200 millivolts
(=second exemplary embodiment of the present invention; cf. FIG. 3B)
44 transistor, in particular p-channel transistor, of the further circuit component 40
(=first exemplary embodiment of the present invention; cf. FIG. 3A)
44' transistor, in particular p-channel transistor, of the further circuit component 40'
(=second exemplary embodiment of the present invention; cf. FIG. 3B)
46' regulating and/or processing element, in particular amplifier and/or comparator, of the further circuit component 40'
(=second exemplary embodiment of the present invention; cf. FIG. 3B)
50 control device, in particular signal source, for controlling (the switching of) the switching element 30, in particular closing switch control or reversing switch control or changeover switch control
(=exemplary embodiment of the present invention; cf. FIG. 1)
C capacitor
(=third example from the prior art; cf. FIG. 5C)
D characteristic, in particular forward characteristic, for example jumping change of the resistance value, of the further circuit component 40, 40'
(=exemplary embodiment of the present invention; cf. FIG. 4)
E light-emitting component, in particular electro-optical transducer, for example light-emitting diode
(=L [ight] E [mitting] D [iode]) or electroluminescent diode or laser, such as semiconductor laser
(=examples from the prior art; cf. FIG. 5A, FIG. 5B, FIG. 5C)
K1 further circuit component, i.e. constant current source for $I_1$
(=examples from the prior art; cf. FIG. 5A, FIG. 5B, FIG. 5C)
K2 second further circuit component, i.e. constant current source for $I_2$
(=examples from the prior art; cf. FIG. 5A, FIG. 5B, FIG. 5C)
K2' third further circuit component, i.e. constant current source for $I_2/2$
(=third example from the prior art; cf. FIG. 5C)
L inductor
(=third example from the prior art; cf. FIG. 5C)
N node point, in particular low-resistance node point, between light-emitting component 20, switching element 30 and further circuit component 40, 40'
(=exemplary embodiment of the present invention; cf. FIG. 1, FIG. 3A, FIG. 3B)
Q voltage source, in particular rechargeable battery unit or accumulator
(=examples from the prior art; cf. FIG. 5A, FIG. 5B, FIG. 5C)
R dummy load
(=first example from the prior art; cf. FIG. 5A)
S1 circuit arrangement
(=first example from the prior art; cf. FIG. 5A)
S2 circuit arrangement
(=second example from the prior art; cf. FIG. 5B)
S3 circuit arrangement
(=third example from the prior art; cf. FIG. 5C)
T control device, in particular signal source, for controlling (the switching of) the switching element U, in particular closing switch control or reversing switch control or changeover switch control
(=examples from the prior art; cf. FIG. 5A, FIG. 5B, FIG. 5C)
U switching element, in particular closing switch or reversing switch or changeover switch
(=examples from the prior art; cf. FIG. 5A, FIG. 5B, FIG. 5C)
W reference potential, in particular earth potential or ground potential or zero potential
Z characteristic, in particular forward characteristic, for example jumping change of the resistance value, of a Zener diode
(=example from the prior art; cf. FIG. 4)

What is claimed is:
1. A circuit for controlling at least one light-emitting component, comprising:
a) at least one first supply element provided for supplying the circuit with voltage;
b) at least one switching element provided for controlling the light-emitting component by switching the switching element at least between a first switching position and a second switching position;
c) at least one further circuit component being provided, and being switched to active or switched on in the second switching position;
d) the further circuit component is at least one voltage-limiting element for varying the operating voltage of the light-emitting component;
e) the voltage-limiting element is disposed in parallel with the switching element in the first switching position; and
f) the voltage-limiting element includes at least one second supply element, supported by a decoupling capacitor on the output side, and at least one transistor, or at least one p-channel transistor, or at least one p-channel field-effect transistor (FET).
2. The circuit according to claim 1, wherein:
a) in the first switching position substantially the entire voltage provided by the first supply element drops across the light-emitting component.
3. The circuit according to claim 1, wherein:
a) the voltage-limiting element is configured for providing a substantially current blocking effect at a low voltage, and is configured for providing a strong current rise starting from a certain critical value or threshold value of the voltage.

4. The circuit according to claim 1, wherein:
a) the voltage-limiting element behaves like at least one diode polarized in the forward direction, or at least one pn diode, or at least one Schottky diode, or like at least one voltage-dependent resistance with non-linear characteristic, or like at least one varistor.

5. The circuit according to claim 1, wherein:
a) the transistor includes a gate connection, to which a voltage, is supplied by the second supply element, and a source connection assigned to a node point connecting the light-emitting component, the switching element and the voltage-limiting element, includes a high resistance and blocks, when the source gate voltage is smaller than the threshold voltage of the transistor, and includes a low resistance and opens, when the source gate voltage is greater than the threshold voltage of the transistor.

6. The circuit according to claim 1, wherein:
a) the voltage-limiting element includes at least one regulating or processing element, or at least one amplifier, or at least one comparator, of the further circuit component; and
b) the regulating or processing element is configured to determine the voltage present at the source connection of the transistor, to compare the determined voltage with the voltage provided by the second supply element, and to activate and to open the transistor connected as source follower, when the voltage provided by the second supply element is smaller than the voltage present at the source connection of the transistor.

7. The circuit according to claim 1, wherein:
a) the voltage-limiting element is provided in series with the light-emitting component in the second switching position.

8. The circuit according to claim 1, wherein:
a) at least one control device for controlling the switching of the switching element, with the control device being assigned to the switching element.

9. A method for controlling at least one light-emitting component, comprising:
a) switching at least one switching element at least between a first switching position and a second switching position;
b) at least one further circuit component is switched to active or switched on in the second switching position;
c) the light-emitting component is controlled by varying its operating voltage;
d) at least one voltage-limiting element for varying the operating voltage of the light emitting components is switched to active or switched on as the at least one further circuit component;
e) the voltage-limiting element is disposed in parallel with the switching element in the first switching position; and
f) the voltage-limiting element includes at least one supply element, supported by a decoupling capacitor on the output side, and at least one transistor, or at least one p-channel transistor, or at least one p-channel field-effect transistor (FET).

10. The method according to claim 9, wherein:
a) the operating voltage of the light-emitting component is limited by switching to active or by switching on the further circuit component.

11. The method according to claim 9, wherein:
a) in the first switching position, the light-emitting component is supplied with substantially the entire voltage provided by at least one supply element.

12. The method according to claim 9, wherein:
a) the voltage-limiting element behaves like one of:
   i) at least one diode polarized in the forward direction, such as at least one pn diode or at least one Schottky diode;
   ii) at least one voltage-dependent resistance with non-linear characteristic; and
   iii) at least one varistor.

* * * * *